(12) United States Patent
Bridges et al.

(10) Patent No.: US 7,381,074 B1
(45) Date of Patent: Jun. 3, 2008

(54) LOCKING AND ACTIVATION MECHANISM FOR A HOT SWAPPABLE DAUGHTER CARD

(75) Inventors: Jeremy Scott Bridges, Apex, NC (US); David L. Hager, Wake Forest, NC (US); Dean F. Herring, Youngsville, NC (US); Daniel Paul Kelaher, Holly Springs, NC (US); Paul Andrew Wormsbecher, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/612,557

(22) Filed: Dec. 19, 2006

(51) Int. Cl.
*H01R 13/62* (2006.01)
(52) U.S. Cl. ........................ 439/325; 439/59
(58) Field of Classification Search ............. 439/325, 439/59, 64, 65, 153, 157
See application file for complete search history.

(56) References Cited

U.S. PATENT DOCUMENTS

| | | | |
|---|---|---|---|
| 4,798,923 A | 1/1989 | Barwick et al. | |
| 5,191,970 A * | 3/1993 | Brockway et al. | 200/335 |
| 5,389,000 A * | 2/1995 | DiViesti et al. | 439/157 |
| 5,675,475 A | 10/1997 | Mazura et al. | |
| 5,959,843 A | 9/1999 | Kurrer et al. | |
| 5,989,043 A | 11/1999 | Han et al. | |
| 6,428,338 B1 * | 8/2002 | Yasufuku et al. | 439/310 |
| 6,494,729 B1 * | 12/2002 | Stathopoulos et al. | 439/160 |
| 6,515,866 B2 | 2/2003 | Ulrich | |
| 6,629,855 B1 * | 10/2003 | North et al. | 439/325 |
| 6,892,263 B1 | 5/2005 | Robertson | |

* cited by examiner

*Primary Examiner*—Tho Dac Ta
*Assistant Examiner*—Travis Chambers
(74) *Attorney, Agent, or Firm*—Cynthia Bryd; Jeffrey L. Streets; Streets & Steele

(57) ABSTRACT

An apparatus and a method for locking a cam lever which positions a second card as inserted into a connector on a first card, and activating the second card with a coupling member. In one embodiment, the second card is inserted between a pair of guides secured to the first card into a connector on the first card. A hinged cam lever on either a guide or the second card positions the second card. A coupling member on the cam lever can be moved to lock the cam lever in place and engage a switch on the second card to activate the second card. When removal of the second card is desired, the coupling member on the cam lever can be moved to unlock the cam lever and disengage the switch on the second card to deactivate the second card.

20 Claims, 3 Drawing Sheets

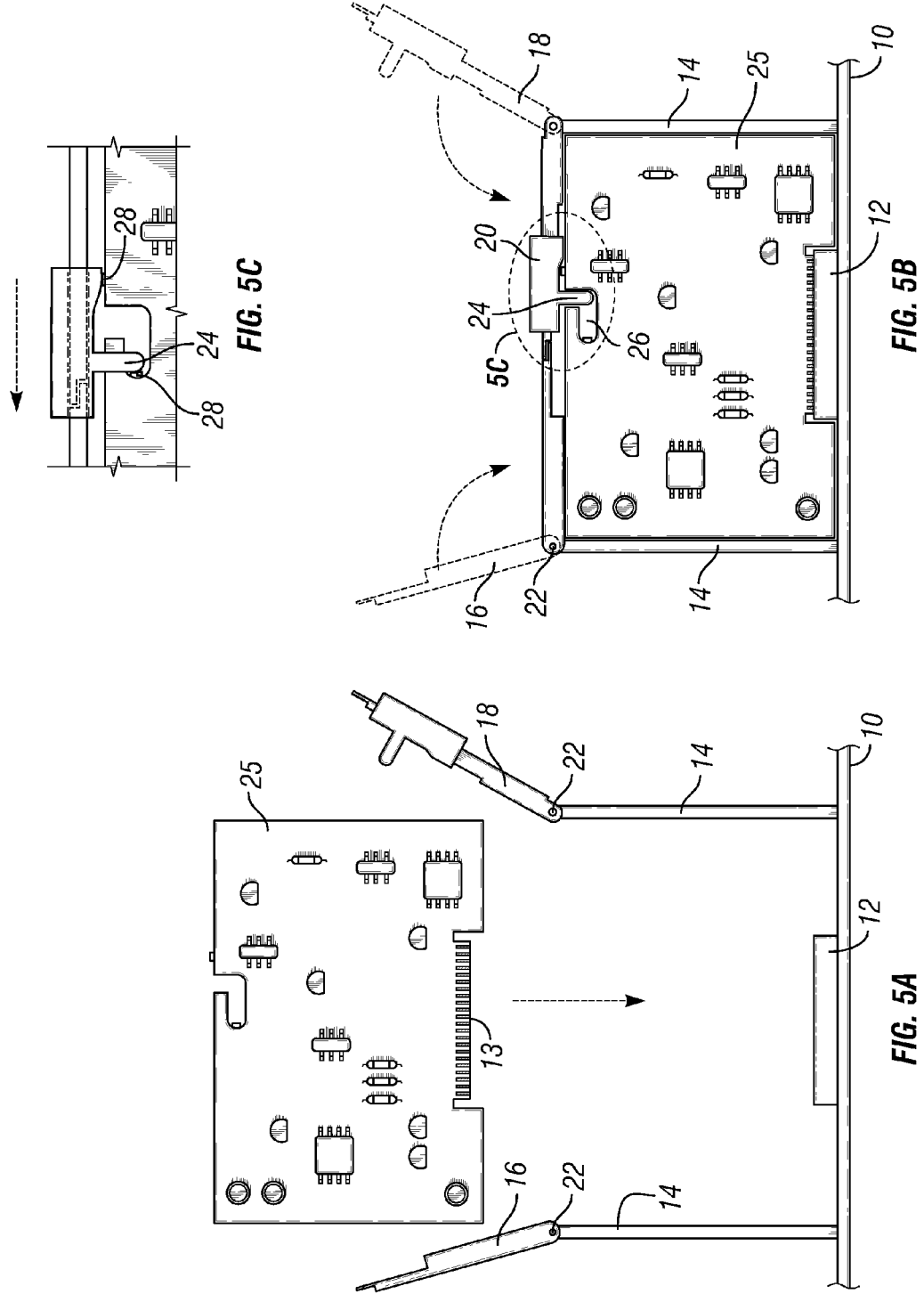

LOCKING AND ACTIVATION MECHANISM FOR A HOT SWAPPABLE DAUGHTER CARD

BACKGROUND OF THE INVENTION

1. Field of the Invention

The present invention relates to the safe insertion and removal of hot-swappable computer components.

2. Description of the Related Art

Hot swappable components have become commonplace in computer systems. Server systems often use hot swappable memory, hard drives, and various pieces of hardware commonly referred to as daughter cards. Hot swapping may involve the removal of a piece of hardware, or the insertion of a piece of hardware, or both while the computer is on and functioning.

Computer systems that support hot swapping need some ability to detect that a component has been removed or inserted and to determine what resources are available for use. Notifying the system that a component has been inserted or removed allows for efficient allocation of resources and the use of computing power.

In addition, all connections need to be designed such that neither the component nor the user can be injured by removing or installing it. Most, if not all, computer components require power to be operational. The electronic connections between components must be designed to ensure that connecting the components will not result in a power surge to either component, which may result in damage to sensitive electronics. Also, care must be taken to avoid electrical shock to the user inserting or removing the component.

The components of the computer system must be designed to accommodate removal or installation of other components. When a component is removed, the computer system must reallocate tasks to other components. When a component is inserted, the system must be able to allocate tasks to that component in order to make the most efficient use of the system resources.

Furthermore, the removal of a hot swappable component must be accomplished in such a manner as to allow the component to complete any operations that are underway, and allow for seamless operation of the computer system. Removal of a component should not result in the loss or corruption of data. The removal or addition of a component should also be possible at any time, to enable the user to make "on-the-fly" adjustments to the computer system.

Therefore, there is a need for a method and apparatus for activating the card after insertion, or deactivating the card prior to removal. It would be desirable for the method and apparatus to provide a locking mechanism to prevent removal prior to deactivation.

SUMMARY OF THE INVENTION

The present invention provides an apparatus and a method for locking a cam lever which positions a second card as inserted into a connector on a first card, and activating the second card with a single coupling member. In one embodiment, the first card has a connector with first and second guides disposed on opposing sides of the connector. Two hinged cam levers pivot to secure the second card to the first card when inserted into the connector on the first card. A coupling member is disposed upon one of the hinged cam levers. A slot in an edge of the second card distal to the connector receives a protuberance on the coupling member. When the hinged cam levers are closed to position and secure the second card, the coupling member may be moved to lock the cam levers in place, lock the second card in place, and engage a switch on the second card to activate the daughter card.

In another embodiment, a first card has a connector with one or more guide disposed adjacent the side of the connector, such as first and second guides disposed on opposing sides of the connector. One or more cam lever pivots to secure the second card to the first card when inserted into the connector on the first card. A coupling member is disposed upon the hinged cam lever. When the hinged cam lever is closed to position the second card, the coupling member may be moved to lock the cam lever in place to a fixed structure on the motherboard, lock the second card in place, and engage a switch on the daughter card to activate the daughter card.

The present invention also provides a method for locking a cam lever which positions a second card as inserted into a connector on a first card, and activating the daughter card with a single coupling member. A cam lever is closed to properly position, and retain the second card in place. A coupling member is axially slid across the cam lever to lock the cam lever, and activate the second card.

BRIEF DESCRIPTION OF THE DRAWINGS

FIGS. 5A-C are a series of side views of a motherboard with a daughter card being inserted.

DETAILED DESCRIPTION OF PREFERRED EMBODIMENTS

Figure 1:
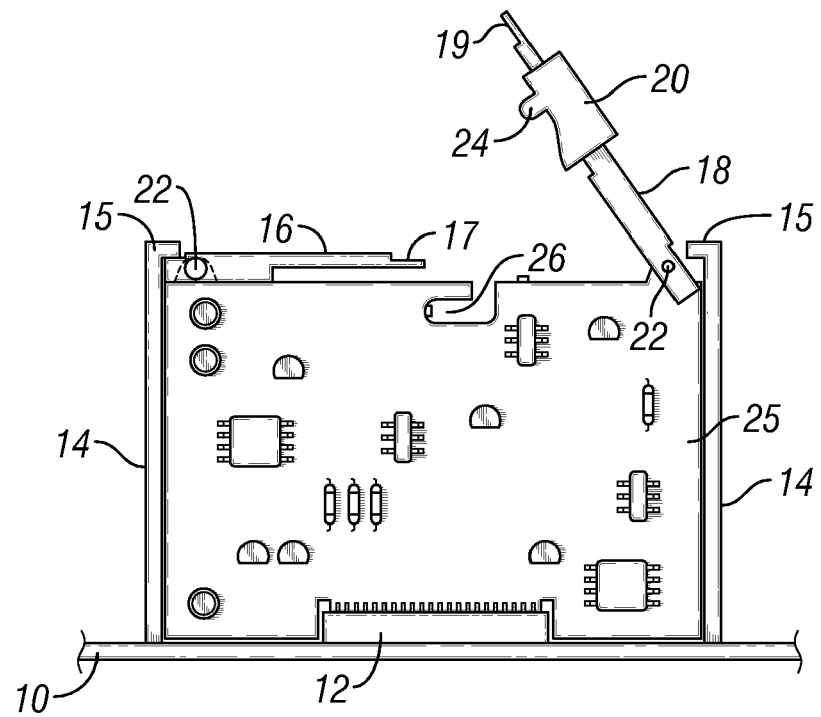
FIG. 1 is a side view of a typical motherboard with a connector receiving a daughter card with hinged cam levers coupled to the daughter card.

The present invention addresses the needs described above. The invention provides an apparatus and a method for locking a cam lever that positions a second card as inserted into a first card, and activating the second card with a single coupling member.

The invention is applicable to any situation where there are two cards that communicate with each other, and it is desirable to control the order in which a second card is inserted and activated, or deactivated and removed relative to a first card. However, for ease of explanation and clarity of the description, the discussion that follows will deal with a typical scenario in which the first card is a motherboard and the second card is a daughter card.

First and second guides are secured to a motherboard on opposite or opposing sides of a connector on the motherboard that is designed to accept the insertion of a daughter card for electronic communication therebetween. A hinged cam lever is disposed on the guide to position and secure the daughter card. In the open position, the cam lever allows for the manual insertion of the daughter card into the motherboard connector. The hinged cam lever is closed to engage and properly position the card.

The hinged cam lever also includes a coupling member that moves between a locked position and an unlocked position. In one embodiment, the coupling member incorporates a protuberance that is alignable with a mating slot in the daughter card when the card is properly positioned. The coupling member and protuberance are designed so that the hinged cam lever may only be fully closed with the coupling member in the unlocked position. Once the hinged cam lever is closed with a daughter card inserted, the coupling member may be moved to the closed position. The coupling member will be moved along the axis of the cam lever to couple with a structure on the motherboard, such as a guide, or an opposing cam lever. In the closed position, the coupling member will lock both the hinged cam lever and the daughter card in place, and activate the daughter card. The coupling of the coupling member with a structure on the motherboard, or an opposing cam lever will prevent the cam lever from rotating at the hinge. Therefore, the cam lever cannot accidentally open and subject the card to damage or removal. Furthermore, when the coupling member is in the locked position, the protuberance on the coupling member will activate the daughter card and enable safe communication between the daughter card and the motherboard.

The protuberance on the coupling member may depress an activation switch on the daughter card as the coupling member is moved from the unlocked position to the locked position. The activation switch may be located anywhere on the daughter card to allow for the coupling member to depress it. The protuberance may be angled, so that the sliding motion depresses the activation switch, or the activation switch may be positioned within the mating slot on the daughter card, so that the locking of the daughter card activates the switch.

In a preferred embodiment, the coupling member locks two opposing hinged cam levers together, while simultaneously locking the daughter card in place, and activating a switch upon the daughter card. The cam levers may be pivotally secured at the top of two opposing guides on either side of the connector on the motherboard. Alternatively, the cam levers may be pivotally secured to the daughter card for engagement with the guide. The two cam levers will preferably allow for even positioning of the daughter card, without uneven pressure on either side of the daughter card. To achieve an even pressure distribution, the locking of the coupling member will preferably occur at approximately the midpoint between the two guides.

FIG. 1 is a side view of a typical motherboard 10 with a connector 12 receiving a daughter card 25. Two guides 14 are secured to the motherboard 10, with one guide 14 disposed on either side of the connector 12. Hinged cam levers 16, 18 are coupled to the daughter card 25 at the hinges 22. The guide 14 has a lip 15 to engage the hinged cam levers 16, 18. The hinges 22 may be of any type to allow motion of the hinged cam levers 16, 18 preferably in the plane of an inserted daughter card 25. While the hinges 22 should allow the cam levers to move out of the path of the lip 15 during insertion, the hinges 22 preferably provide enough of a range of motion for the hinged cam lever 16, 18 to achieve this purpose. The hinged cam lever 18 has a seating surface 19 to match the seating surface 17 of the opposing hinged cam lever 16. The hinged cam lever 18 also includes a coupling member 20, with a protuberance 24 that is alignable to mate with a slot 26 in the daughter card 25.

Figure 2:
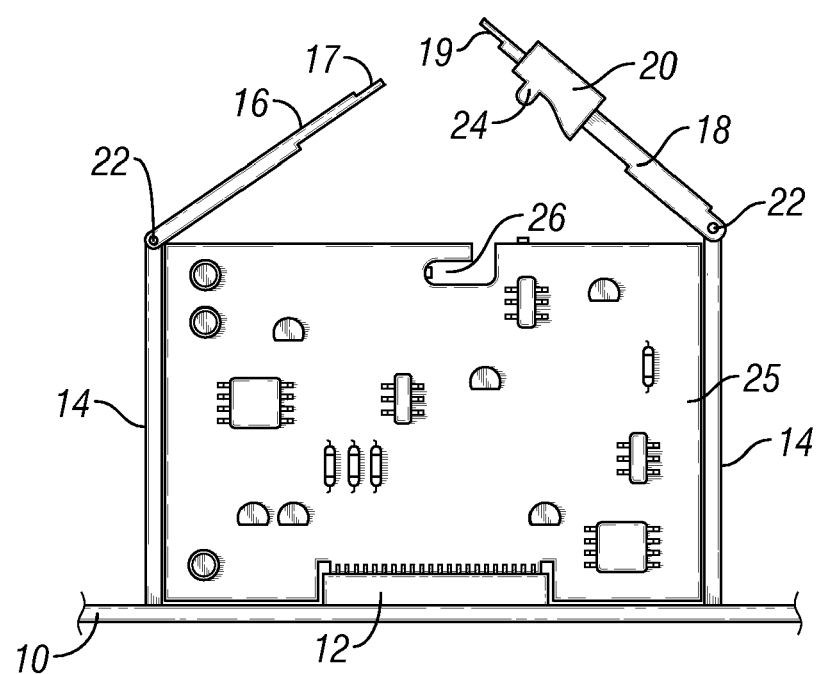
FIG. 2 is a side view of a daughter card operatively received in the connector on the motherboard with hinged cam levers coupled to guides secured to the motherboard and disposed in an open position.

FIG. 2 is a side view of a typical motherboard 10 with a connector 12 receiving a daughter card 25. In this embodiment, two guides 14 are secured to the motherboard 10, with one guide 14 disposed on either side of the connector 12. Hinged cam levers 16, 18 are pivotally coupled to the guide 13. The hinges 22 may be of any type to allow motion of the hinged cam levers 16, 18, preferably in the plane of an inserted daughter card 25. While the hinges 22 should allow the cam levers to move out of the path of a daughter card during insertion, the hinges 22 preferably allow at least ninety degrees of motion for the hinged cam lever 16, 18 for this purpose. The hinged cam lever 18 has a seating surface 19 to match the seating surface 17 of the opposing hinged cam lever 16. The hinged cam lever 18 also includes a coupling member 20, with a protuberance 24 that is alignable to mate with a slot 26 in the daughter card 25.

Figure 3:
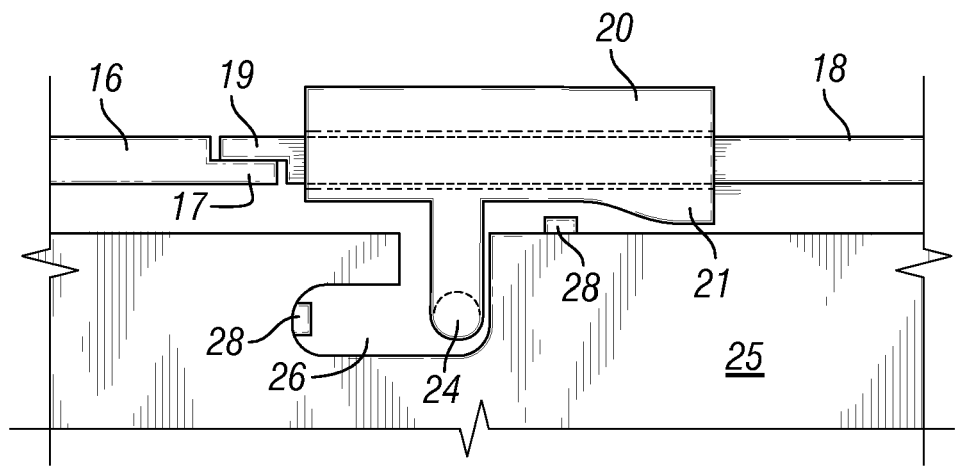
FIG. 3 is a partial side view of a daughter card operatively received in the connector on the motherboard with the hinged cam levers in a closed position.

FIG. 3 is a partial side view of the daughter card 25 operatively received in the connector (not shown) positioned by the hinged cam levers 16, 18 on the motherboard (not shown), with the coupling member 20 in the unlocked position. A protuberance 24 on the coupling member 20 fits within the slot 26 in the edge of the daughter card 25. An angled portion 21 of the coupling member 20 is distal to the seating surface 19 of the hinged cam lever 18. The daughter card 25 has an activation switch 28 positioned to be depressed when the coupling member 20 is moved to the locked position (to the left in FIG. 2). It should be recognized that the angled portion 21 in combination with the adjacent switch or sensor 28 is just one example. Note that the activation switch 28 may alternatively be located within or adjacent to the slot 26 in the daughter card for activation by the protuberance 24 when the coupling member 20 has been slid to a fully locked position (See FIG. 3). As shown, the protuberance 24 preferably extends downward and then substantially horizontally in order to latch the coupling member 20 to the daughter card 25. Preferably, the protuberance 24 forms a "U-shaped" member that hooks into a horizontal leg of the slot 26. The switch may be disposed in any other desirable location for selective engagement with a portion of the coupling member when in a locked position.

Figure 4:
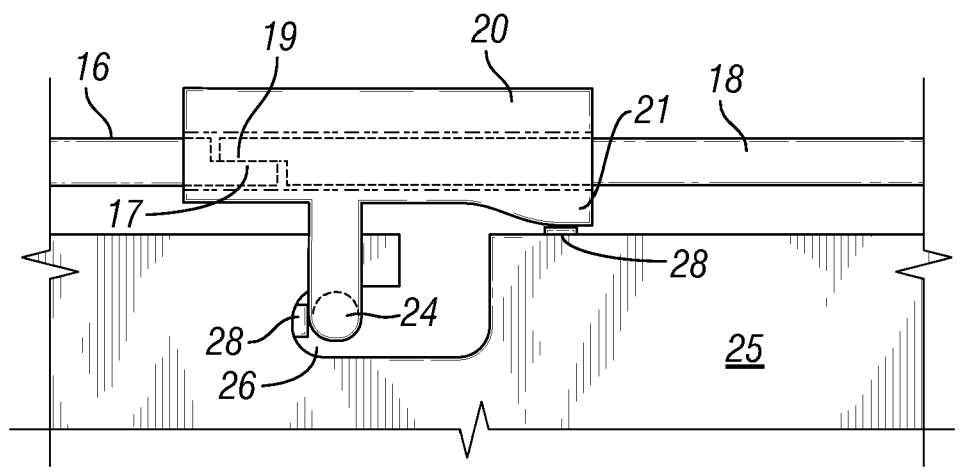
FIG. 4 is a partial side view of a daughter card operatively received in the connector on the motherboard with the coupling member in a locked position.

FIG. 4 is a partial side view of daughter card 25 operatively received in the connector (not shown) positioned by the hinged cam levers 16, 18 on the motherboard (not shown), with the coupling member 20 in the locked position. The protuberance 24 depresses the activation switch 28 on the daughter card 25. In this position, the protuberance 24 is disposed within a second leg of the slot 26 in the daughter card 25 and prevents opening of the cam levers 16, 18. It should be recognized that the locking and activating mechanisms described in FIGS. 3 and 4 are consistent with either of the embodiments of FIGS. 1 and 2.

In a second embodiment, a single cam lever may be utilized to position the daughter card. The coupling member would then lock the single cam lever directly to a structure on the motherboard, such as the second guide, while simultaneously locking the daughter card and activating a switch upon the daughter card.

While the above embodiments show a mechanical switch being depressed on the daughter card, one skilled in the art will see that any switching mechanism may be used. For example, the coupling member may release a switch in the locked position which was depressed in the unlocked position in order to activate the daughter card. The coupling member may also complete a circuit to provide power to the daughter card in the locked position. Any mechanism of activating the daughter card while also locking the hinged cam lever and daughter card may be implemented.

The present invention also provides a method for locking the hinged cam lever, the daughter card, and activating the daughter card with a single coupling member. Upon insertion of a daughter card into the motherboard, the daughter card is positioned by at least one hinged cam lever. Preferably, the cam lever cannot be fully closed if the daughter card is improperly positioned. Furthermore, the daughter card may not be removed with the cam lever in the closed position. The cam lever is locked in place by a coupling member, wherein the coupling member also activates the daughter card when the coupling member is in the locked position. The activation of the daughter card may be accomplished by engaging a switch with the coupling member, disengaging a switch which was engaged, completing a circuit with the coupling member, or any other means that activates the daughter card when the coupling member is in the locked position or as the coupling member is being locked.

FIGS. 5A-5C are a series of side views of a motherboard 10 with a daughter card 25 being inserted, locked and activated. In FIG. 5A (step one), the hinged cam levers 16, 18 are in the open position. The hinge 22 allows the hinged cam levers 16, 18 to be moved out of the path of the daughter card 25. The daughter card 25 is operatively received by the connector 12 on the mother board 10. The guides 14 ensure that the daughter card 25 is inserted at the correct angle to the motherboard 10 and the connector 12 on the motherboard. The daughter card 25 will have a connector 13 which mates with the connector 12 on the motherboard. While this figure shows two cam levers 16, 18, a single cam lever may be similarly utilized to position the daughter card 25.

In FIG. 5B (step two), the daughter card 25 has been received by the mother board 10 in the connector 12. The cam levers 16, 18 are then closed to properly position and secure the daughter card 25. The hinges 22 for the cam levers 16, 18 are at the proper height on the guides 14 so that a portion of the cam levers push downward on the upper edge of the daughter card to ensure complete insertion of the daughter card 25. A protuberance 24 on the coupling member 20 is received in a first leg of the slot 26 in the daughter card.

In FIG. 5C (step three), the coupling member 20 is moved (to the left in FIG. 4C) to lock the cam levers 16, 18 in place. Since the coupling member 20 closely encompasses the mating seating surfaces 17, 19, the cam levers are effectively interlocked. Simultaneously, the protuberance 24 locks the daughter card 25 in place and locks the cam levers down against the daughter card. As the daughter card 25 is locked in place, the coupling member 20 also activates the daughter card 25. This activation may be accomplished via depressing a switch 28 with either the protuberance 24 of the coupling member 20, or the coupling member 20 itself. When the above steps are performed in reverse, the daughter card is safely deactivated, the cam lever is unlocked, and the daughter card may be removed from the motherboard.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus comprising:
   a first circuit board having a first electronic connector;
   a second circuit board having a second electronic connector configured for electronically interfacing with the first electronic connector to enable electronic communication between the first and second circuit boards and a switch configured for activating the second circuit board in response to engagement of the switch;
   first and second guides secured to the first circuit board on opposing sides of the first electronic connector;
   a first cam lever pivotally supported on the first guide and moveable from an open position to a closed position while contacting the second circuit board to secure the second circuit board to the first circuit board;
   a second cam lever pivotally supported on the second guide and moveable from an open position to a closed position while contacting the second circuit board to secure the second circuit board to the first circuit board; and
   a coupling member slidably supported on one of the first cam lever and the second cam lever and slidably moveable from an unlocked position to a locked position such that the coupling member is coupled with the other of the first cam lever and the second cam lever in the locked position, and wherein the locked position of the coupling member locks the first cam lever in the closed position and engages the switch on the second circuit board.

2. The apparatus of claim 1, wherein the first cam lever is secured to the first guide by a hinge.

3. The apparatus of claim 1, wherein the guides are disposed at an angle perpendicular to the plane of the first circuit board to ensure the proper insertion of the second printed circuit board into the electronic connector of the first circuit board.

4. The apparatus of claim 1, wherein the first cam lever, when moved to the closed position, engages the second circuit board to urge the second circuit board toward the first circuit board such that the second electronic connector is inserted into the first electronic connector.

5. The apparatus of claim 1, wherein the switch on the second circuit board activates the second circuit board by completing a circuit with the coupling member in the locked position, and deactivates the second circuit board with the coupling member in the unlocked position by opening the circuit.

6. The apparatus of claim 1, wherein the first circuit board comprises a motherboard and the second circuit board comprises a daughter card.

7. The apparatus of claim 1, further comprising a seating surface on the first cam lever and a seating surface on the second cam lever that mates with the seating surface on the first cam lever.

8. The apparatus of claim 1, wherein the coupling member closely encompasses the mating seating surfaces in the locked position, to interlock the first and second cam levers.

9. The apparatus of claim 1, further comprising:
   a protuberance on the coupling member; and a mating slot in the circuit board, wherein the protuberance is received in the mating slot when the coupling member is moved from the unlocked position to the locked position.

10. The apparatus of claim 9, wherein the switch is disposed within the mating slot such that the protuberance engages the switch when the coupling member is moved to the locked position.

11. An apparatus for connecting first and second circuit boards, comprising:
- a first electronic connector on the first circuit board;
- a second electronic connector on the second circuit board configured for electronically interfacing with the first electronic connector to place the first and second circuit boards in electronic communication;
- one or more guide adjacent the first connector for positioning the second circuit board with respect to the first circuit board to align the second electronic connector with the first electronic connector for coupling;
- opposing cam levers pivotally secured to the one or more guide and movable into contact with the second circuit board to a closed position to couple the first and second electronic connectors;
- a switch on the second circuit board configured for activating the second circuit board; and
- a coupling member movable from an unlocked position to a locked position for removably locking the first and second cam levers together when the opposing cam levers are in the closed position, wherein movement of the coupling member to the locked position also engages the switch.

12. The apparatus of claim 11, wherein the opposing cam levers are pivotable toward one another to move the cam levers to the closed position.

13. The apparatus of claim 11, wherein movement of the opposing cam levers from the open position to the closed position is in the plane of the second circuit board.

14. The apparatus of claim 11, wherein the coupling member is slidably secured to one of the opposing cam levers such that the coupling member is slidable along the axis of that coupling member into contact with the other opposing cam lever to move the coupling member from the unlocked position to the locked position.

15. The apparatus of claim 11, wherein the locking of the coupling member occurs at approximately the midpoint between the two guides.

16. The apparatus of claim 11, further comprising:
- a slot on the second circuit board generally aligned in a direction of movement of the coupling member when the lever arms are in the closed position; and
- a protuberance on the coupling member that moves into the slot as a result of movement of the coupling member from the unlocked position to the locked position.

17. The apparatus of claim 16, wherein the switch is disposed along the slot, such that the protuberance engages the switch when the coupling member is moved to the locked position.

18. The apparatus of claim 17, wherein the slot is positioned on the second circuit board such that the protuberance on the coupling member is only aligned to move into the slot when the second circuit board is properly positioned.

19. The apparatus of claim 11, further comprising a seating surface on the first cam lever and a seating surface on the second cam lever that mates with the seating surface on the first cam lever.

20. The apparatus of claim 19, wherein the coupling member closely encompasses the mating seating surfaces in the locked position, to interlock the first and second cam levers.

* * * * *